United States Patent
Kim

(10) Patent No.: US 8,536,606 B2
(45) Date of Patent: Sep. 17, 2013

(54) LIGHT EMITTING DEVICE, LIGHT EMITTING DEVICE PACKAGE INCLUDING THE SAME AND LIGHTING SYSTEM

(75) Inventor: Shin Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/361,612

(22) Filed: Jan. 30, 2012

(65) Prior Publication Data
US 2013/0001616 A1  Jan. 3, 2013

(30) Foreign Application Priority Data
Jun. 30, 2011 (KR) .................. 10-2011-0064935

(51) Int. Cl.
*H01L 33/36* (2010.01)
(52) U.S. Cl.
USPC ............................................. 257/98
(58) Field of Classification Search
USPC ............................................. 257/98; 438/141
See application file for complete search history.

(56) References Cited

U.S. PATENT DOCUMENTS

| | | | |
|---|---|---|---|
| 7,709,849 B1 | 5/2010 | Kal et al. | |
| 2004/0132264 A1* | 7/2004 | Yaung et al. | 438/455 |
| 2004/0247949 A1* | 12/2004 | Akedo et al. | 428/704 |
| 2007/0176194 A1* | 8/2007 | Wakamatsu et al. | 257/98 |
| 2007/0241348 A1* | 10/2007 | Inoue et al. | 257/88 |
| 2007/0284590 A1* | 12/2007 | Goto et al. | 257/79 |
| 2008/0272382 A1* | 11/2008 | Kim et al. | 257/94 |
| 2009/0008672 A1 | 1/2009 | Osawa et al. | |
| 2009/0173962 A1* | 7/2009 | Hanawa et al. | 257/99 |
| 2009/0278158 A1* | 11/2009 | Fukunaga et al. | 257/99 |
| 2010/0012971 A1* | 1/2010 | Hiraoka et al. | 257/103 |
| 2010/0140643 A1* | 6/2010 | Cho et al. | 257/98 |
| 2010/0176416 A1* | 7/2010 | Kim et al. | 257/98 |
| 2010/0200884 A1* | 8/2010 | Lee et al. | 257/98 |
| 2010/0207145 A1* | 8/2010 | Yoo | 257/98 |
| 2011/0012150 A1* | 1/2011 | Kim et al. | 257/98 |
| 2011/0012155 A1* | 1/2011 | Huang et al. | 257/98 |
| 2011/0042704 A1* | 2/2011 | Kim et al. | 257/98 |
| 2011/0121335 A1* | 5/2011 | Takakusaki et al. | 257/98 |
| 2011/0266551 A1* | 11/2011 | Thompson et al. | 257/76 |
| 2012/0001205 A1* | 1/2012 | Lee et al. | 257/89 |
| 2012/0019741 A1* | 1/2012 | Park | 349/62 |
| 2012/0032212 A1* | 2/2012 | Huang et al. | 257/98 |
| 2012/0032214 A1* | 2/2012 | Ito et al. | 257/98 |
| 2012/0056153 A1* | 3/2012 | Saito et al. | 257/13 |
| 2012/0056155 A1* | 3/2012 | Asakawa et al. | 257/13 |
| 2012/0241757 A1* | 9/2012 | Kim et al. | 257/76 |

FOREIGN PATENT DOCUMENTS

| | | |
|---|---|---|
| EP | 2330629 A1 | 6/2011 |
| JP | 2011-86613 A | 4/2011 |

* cited by examiner

*Primary Examiner* — Thao P. Le
(74) *Attorney, Agent, or Firm* — Birch, Stewart, Kolasch & Birch, LLP

(57) ABSTRACT

Disclosed is a light emitting device including a light emitting structure comprising a first conductive type semiconductor layer, an active layer and a second conductive type semiconductor layer, a first electrode disposed on the first conductive type semiconductor layer, a second electrode disposed on the second conductivity type semiconductor layer, and a low temperature oxide film disposed on the light emitting structure, with an irregular thickness.

20 Claims, 15 Drawing Sheets

LIGHT EMITTING DEVICE, LIGHT EMITTING DEVICE PACKAGE INCLUDING THE SAME AND LIGHTING SYSTEM

CROSS-REFERENCE TO RELATED APPLICATION

This application claims priority under 35 U.S.C. §119 from Korean Application No. 10-2011-0064935 filed on Jun. 30, 2011, the subject matter of which is hereby incorporated in its entirety by reference as if fully set forth herein.

TECHNICAL FIELD

Embodiments may relate to a light emitting device, a light emitting device package including the same and a lighting system.

BACKGROUND

Due to development of thin film growth techniques and device materials, light emitting devices such as light emitting diodes and laser diodes using III-V or II-VI compound semiconductor materials may realize red, green, blue and various color light and ultraviolet light and may realize white light having high efficiency through fluorescent materials or color mixing.

Due to development of such techniques, those light emitting devices have been increasingly applied not only to display devices but also to transmission modules of light communication means, light emitting diode backlights substituting for cold cathode fluorescent lamps composing backlights of liquid crystal displays (LCD), white light emitting diode lighting apparatus substituting for fluorescent lamps or incandescent lamps, head lights of vehicles and street lights.

SUMMARY

Accordingly, the embodiments may provide a light emitting device, a light emitting device package including the same and a lighting system.

In one embodiment, a light emitting device includes a light emitting structure comprising a first conductive type semiconductor layer, an active layer and a second conductive type semiconductor layer; a first electrode disposed on the first conductive type semiconductor layer; a second electrode disposed on the second conductivity type semiconductor layer; and a low temperature oxide film disposed on the light emitting structure, with an irregular thickness.

Unevenness may be formed on a surface of the low temperature oxide film.

The low temperature oxide film may include an insulative material.

The low temperature oxide film may be configured of at least two layers.

The low temperature oxide film may be disposed at least one of a surface of the first conductive type semiconductor layer and a surface of the second conductive type semiconductor layer.

The low temperature oxide film may include a first layer disposed on the light emitting structure and a second layer disposed on the first layer.

The first layer may be disposed on a surface of the light emitting structure and the second layer may be selectively disposed on a surface of the first layer.

The thickness of the first layer may be 1 to 5 micrometers and the thickness of the second layer may be 1 to 5 micrometers.

The low temperature oxide film may include silicon oxide.

The low temperature oxide film may be deposited at 400~450° C.

The low temperature oxide film may be formed of a transmissive material.

The thickness of the low temperature oxide film may be 1 to 10 micrometers.

The light emitting device may further include a passivation layer disposed on a lateral surface of the light emitting structure and the passivation layer may be in contact with a lateral surface of the low temperature oxide film.

In another embodiment, a light emitting device package includes a package body; a first lead frame and a second lead frame disposed on the package body; the light emitting device mentioned above, which is disposed on the package body to be electrically connected with the first lead frame and the second lead frame; and a molding part to surround lateral surfaces and a top surface of the light emitting device.

The low temperature oxide film may be disposed on the molding part.

A phosphor layer coated on the light emitting device may be further provided and the low temperature oxide film may be disposed on a surface of the phosphor layer.

A lens disposed on the molding part may be further provided and the low temperature oxide film may be disposed on the lens.

In a further embodiment, a lighting system includes a light emitting device package having a package body, a first lead frame and a second lead frame disposed on the package body, the light emitting device mentioned above, which is disposed on the package body to be electrically connected with the first lead frame and the second lead frame; a circuit board electrically connected to the light emitting device package; and an optical member to transmit light emitting from the light emitting device package.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
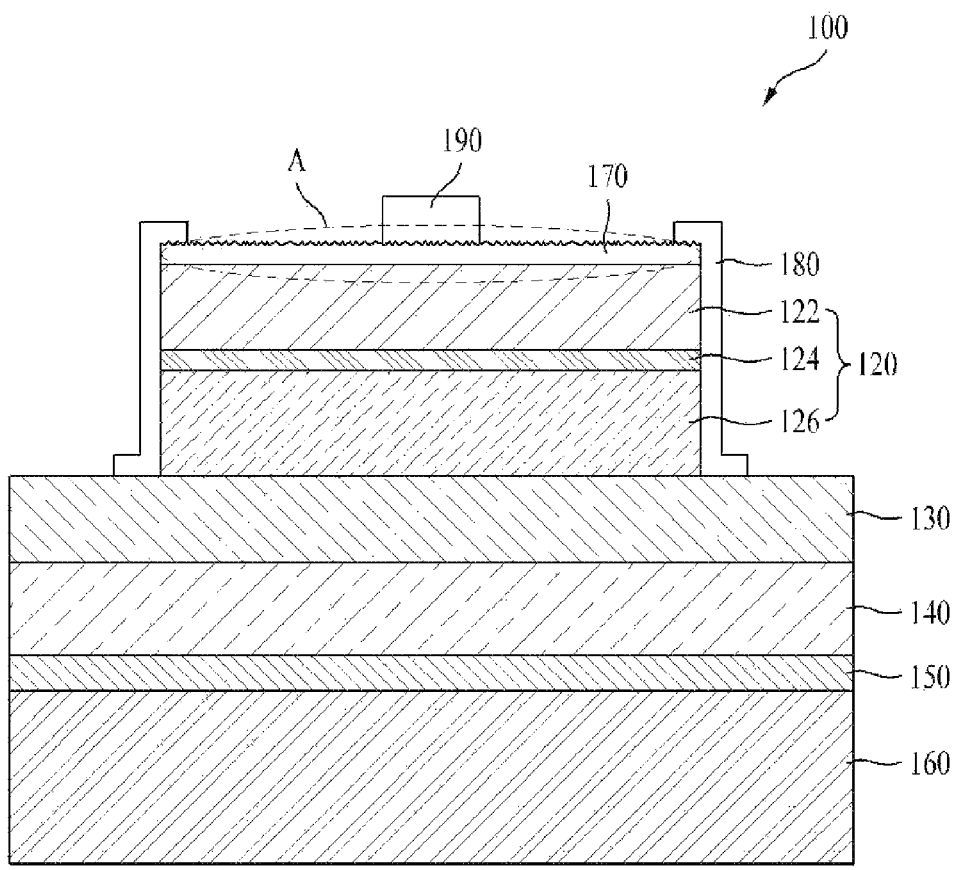
FIG. 1 is a sectional view illustrating a light emitting device according to an embodiment.

Hereinafter, embodiments will be described with reference to the annexed drawings.

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

The thickness or size of each layer shown in the drawings may be exaggerated, omitted or schematically illustrated. The size of each element illustrated in the drawings may not reflect the substantial size fully.

FIG. 1 is a sectional view illustrating a light emitting device according to an embodiment.

The light emitting device according to this embodiment may include an adhesion layer 150, a reflective layer 140, an ohmic layer 130 and a light emitting structure 120 and a low temperature oxide 170, which are disposed on a metal support 160. In these embodiments or other embodiments, the light emitting device may be semiconductor light emitting device, for example light emitting diode.

The metal support 160 may be employed as a second electrode and a metal material having a high electrical conductivity may be used for the metal support 160. Also, a metal material having a high thermal conductivity may be used, because the metal support 160 has to sufficiently radiate heat generated while the light emitting device is operating.

The metal support 160 may be formed of a selected material from a group configured of molybdenum (Mo), silicon (Si), tungsten (W), copper (Cu) and aluminum (Al) or an alloy of the group. In addition, the metal support 160 may selectively include gold (Au), copper alloy (CuAlloy), nickel (Ni), copper-tungsten (Cu—W) and carrier wafer (for example, GaN, Si, Ge, GaAs, ZnO, SiGe, SiC, SiGe and $Ga_2O_3$).

Furthermore, the metal support 160 may have a predetermined mechanical hardness to prevent warpage of the entire nitride semiconductor and to separate the semiconductor as an independent chip through scribing and breaking processes smoothly.

The adhesion layer 150 may enable the reflective layer 140 to adhere to the metal support 160. The reflective layer 140 may implement the function of the adhesion layer. The adhesion layer 150 may be formed of a selected material from a group configured of gold (Au), tin (Sn), indium (IN), aluminum (Al), silicon (Si), silver (Ag), nickel (Ni) and copper (Cu) or an alloy of the group.

The reflective layer 140 may have a thickness of approximately 2500 angstroms. The reflective layer 140 may be a metal layer including aluminum (Al), silver (Ag), nickel (Ni), platinum (Pt), rhodium (Rh) or an alloy of Al, Pt or Rh. The aluminum or the silver may reflect the light generated from an active layer 124 effectively, only to enhance light extraction efficiency of the light emitting device.

The light emitting structure 120, especially, a second conductive type semiconductor layer 126 may have a high contact resistance because it has a low impurity doping concentration. Due to the low contact resistance, the light emitting structure 120, especially, the second conductive type semiconductor layer 126 may not have a good ohmic property. To enhance such an ohmic property, a transparent electrode may be formed as the ohmic layer 130.

The ohmic layer 130 may have a thickness of approximately 200 angstroms. The ohmic layer 130 may include at least one of indium tin oxide (ITO), indium zinc oxide (IZO0, indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au and Hf. This embodiment may not be limited by those materials.

The light emitting structure 120 may include a first conductive type semiconductor layer 122, an active layer 124 formed on the second conductive type semiconductor layer 126 to emit light and a first conductive type semiconductor layer 122 formed on the active layer 124.

The first conductive type semiconductor layer 122 may be a III-V compound semiconductor having a first conductive type dopant doped thereon. In case the first conductive type semiconductor layer 122 is n-semiconductor layer, the first conductive type dopant may be n-dopant, including Si, Ge, Sn and Te. the embodiment may not be limited by the materials, The first conductive type semiconductor layer 122 may include a semiconductor material having an empirical formula: $Al_xIn_yGa_{(1-x-y)}N$ ($0 \leq x \leq 1$, $0 \leq y \leq 1$, $0 \leq x+y \leq 1$). The first conductive type semiconductor layer 122 may be formed of at least one of GaN, InN, AlN, InGaN, AlGaN, InAlGaN, AlInN, AlGaAs, InGaAs, AlInGaAs, GaP, AlGaP, InGaP, AlInGaP and InP.

The active layer 124 may be a layer that emits light having an energy determined by an energy band of an active layer (a luminous layer) material formed generated when an electron injected via the first conductive semiconductor layer 122 meets a hole injected via the second conductive type semiconductor layer 126 after that. The light emitted from the active layer 124 may be at an ultraviolet ray rather than a visible ray range.

The active layer 124 may be formed in at least one of Single Quantum Well, Multi-quantum Well (MQW), Quantum Wire and Quantum Dot structures. For example, the active layer 124 may be formed in the Multi-quantum Well structure, with trimethyl gallium gas (TmGa), ammonia gas ($NH_3$), nitrogen gas ($N_2$) and trimethyl indium gas (TMIn) injected therein. This embodiment may not be limited thereto.

The well and barrier layers of the active layer 124 may be formed in a pair structure configured of at least one of InGaN/GaN, InGaN/InGaN, GaN/AlGaN, InAlGaN/GaN, GaAs(InGaAs)/AlGaAs and GaP(InGaP)/AlGaP and this embodiment is not limited thereto. The well layer may be formed of a material having a predetermined band gap that is lower than a band gap of the barrier gap.

A conductive clad layer (not shown) may be formed on and/or under the active layer 124. The conductive clad layer may be formed of AlGaN-based semiconductor and it may have a higher band gap than the active layer 164 does.

The second conductive type semiconductor layer 126 may include a III-V compound semiconductor having a second conductive type dopant doped thereon, for example, a semiconductor material having an empirical formula: $Al_xIn_yGa_{(1-x-y)}N$ ($0 \leq x \leq 1$, $0 \leq y \leq 1$, $0 \leq x+y \leq 1$). When the second conductive type semiconductor layer 126 is a p-semiconductor, the second conductive type dopant may be a p-dopant including Mg, Zn, Ca, Sr and Ba.

Alternatively, the first conductive type semiconductor layer 122 may include a p-semiconductor layer and the second conductive semiconductor layer 126 may include an n-semiconductor layer.

On the light emitting structure 120, in other words, on a surface of the first conductive type semiconductor layer 122 may be formed a low temperature oxide film 170. The low temperature oxide film 170 may be formed of a light: transmissive material and it may include silicon oxide($SiO_2$) that is an insulating material. The low temperature oxide film 170 may be deposited at 400~450° C. and unevenness may be formed on a surface of the low temperature oxide film 170.

A first electrode 190 may be formed on the surface of the low temperature oxide film 170. The first electrode 190 may include at least one of aluminum (Al), titanium (Ti), chrome (Cr), nickel (Ni), copper (Cu), gold (Au), with a unilayer or multilayer structure.

A passivation layer 180 may be formed on lateral surfaces of the light emitting structure 120 and the passivation layer 180 may be also formed on lateral surfaces of the low temperature oxide film 170.

The passivation layer 180 may be formed of a heat insulative material and the insulative material may be a non-conductive oxide film or nitride. For example, the passivation layer 180 may be configured of a silicon oxide ($SiO_2$) layer, an oxinitride layer and aluminum oxide layer.

In the light emitting device according to this embodiment, the low temperature oxide film having the irregular structure may be formed on the surface of the light emitting structure. Because of that, extraction efficiency of the light emitted from the light emitting structure may be enhanced. The low temperature oxide film may have a thickness of 1~10 micrometers. The nanometer-sized unevenness may be formed in the low temperature oxide film and the light may be refracted by the unevenness, only to increase an orientation angle of the light emitted outside based on the refraction.

Figure 2A:
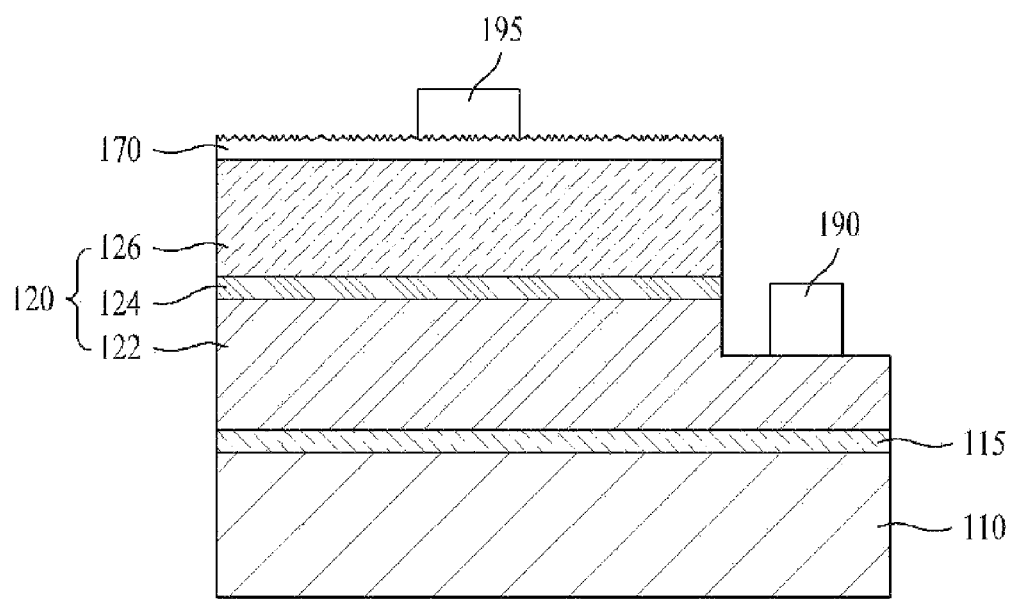
FIGS. 2A and 2B are sectional views illustrating a light emitting device according to another embodiment.
Figure 2B:
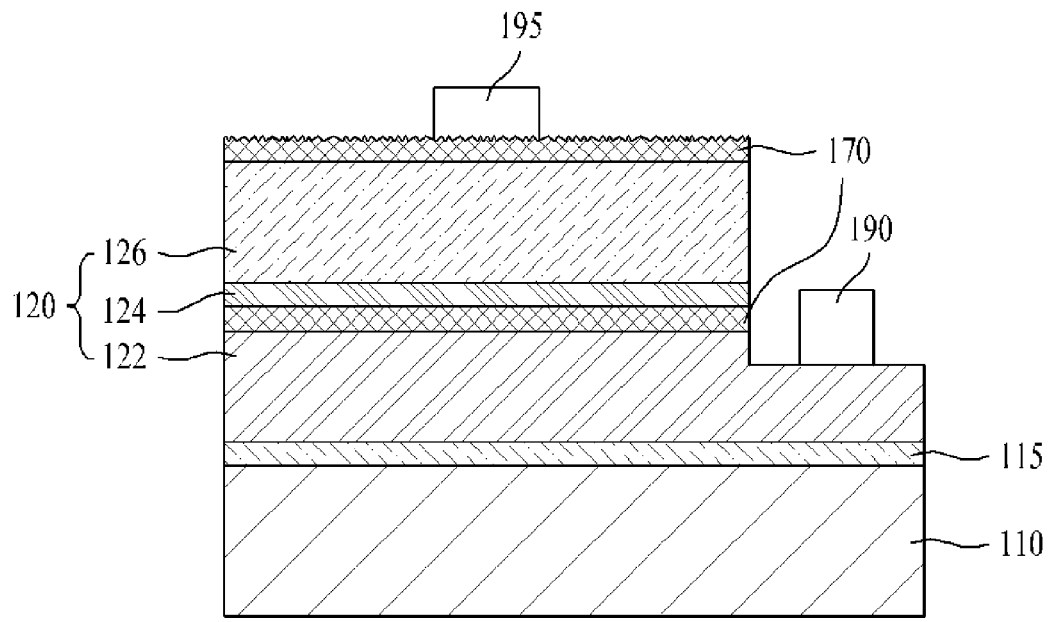

FIGS. 2A and 2B are sectional views illustrating a light emitting device according to other embodiments.

FIG. 2A illustrates a horizontal light emitting device. Mesa-etching may be formed to the second conductive type semiconductor layer 126 and the active layer 124 and a predetermined region of the first conductive type semiconductor layer 122, to partially expose the first conductive type semiconductor layer 122. In other words, when the substrate 110 is formed of an insulative material, a predetermined space has to be formed to form an electrode therein and an electric current may be supplied to the predetermined region of the first conductive type semiconductor layer 122.

A buffer layer 115 may be formed between the substrate 110 and the light emitting structure 120. The buffer layer 115 may be employed to reduce lattice mismatch of the materials between the light emitting structure 120 and the substrate 110 and to reduce a difference of thermal expansion coefficients there between. The buffer layer 115 may be formed of a III-V compound semiconductor, for example, at least one of GaN, InN, AlN, InGaN, AlGaN, InAlGaN and AlInN.

The low temperature oxide film 170 may be disposed on the light emitting structure 120 and a first electrode 190 may be disposed on the exposed region of the first conductive type semiconductor layer 122. The first electrode 190 may include at least one of aluminum (Al), titanium (Ti), chrome (Cr), nickel (Ni), copper (Cu) and cold (Au), with a unilayer or multilayer structure.

A second electrode 195 may be disposed on the low temperature oxide film 170. When the low temperature oxide film 170 is an insulative material, the second electrode 195 may be directly in contact with the second conductive type semiconductor layer 126.

In the embodiment shown in FIG. 2B, the low temperature oxide film 170 may be disposed on a surface of the first conductive type semiconductor layer 122.

FIGS. 3A to 3D are sectional views illustrating a light emitting device package according to an embodiment.

Figure 3A:
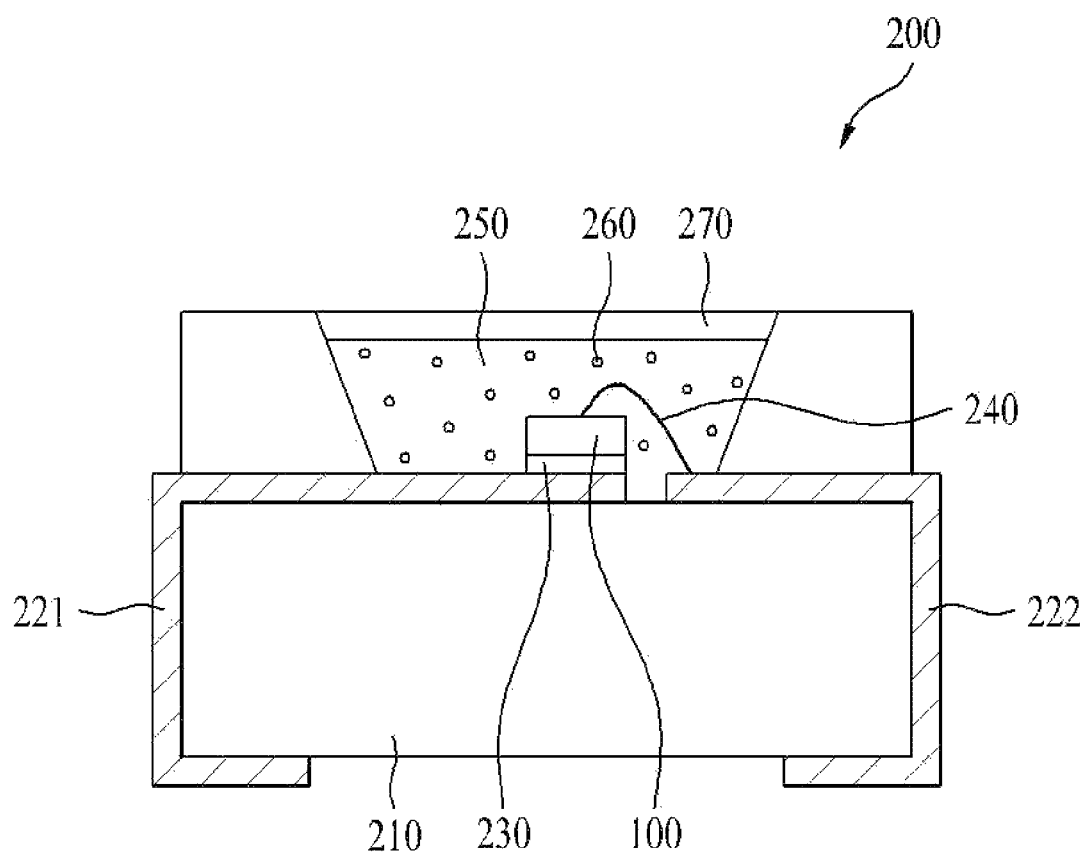
FIGS. 3A to 3D are sectional views illustrating a light emitting device package according to an embodiment.

A light emitting device package 200 shown in FIG. 3A may include a package body 210 having a capacity, a first lead frame 221 and a second lead frame 222 installed on the package body 210, the light emitting device 100 according to the embodiments mentioned above that is electrically connected to the first lead frame 221 and the second lead frame 222, and a molding part 250 formed on the cavity.

The package body 210 may be formed of PPA resin, silicon, synthetic resin or metal. When the package body 210 is formed of a conductive material such as metal, an insulation layer may be coated on a surface of the package body 210 to prevent electrical shorting between the first and second lead frames 221 and 222, although not shown in the drawings.

The first lead frame 211 and the second lead frame 222 may be electrically separated from each other and they may supply electric currents to the light emitting device 100. In addition, the first lead frame 221 and the second lead frame 222 may increase luminous efficiency by reflecting the light generated from the light emitting device 100 and they may exhaust the heat generated from the light emitting device 100 outside.

The light emitting device 100 may be installed on the package body 210 or on either of the first and second lead frames 221 and 222. According to this embodiment, the first lead frame 221 and the light emitting device 100 may be connected via a conductive adhesion layer 230. The second lead frame 222 and the light emitting device 100 may be bonded to each other by a wire 240. Rather than the wire bonding, flip chip bonding or die bonding may be performed between the light emitting device 100 and the lead frames 221 and 222.

The molding part 250 may surround and protect the light emitting device 100. Also, phosphors 260 may be provided in the molding part 250 and the phosphors 260 may be may be conformal-coated as an independent layer from the molding part 250.

The phosphors 260 may perform excitation to the light emitted from the light emitting device 100 at a first wavelength range. After that, the light at the first wavelength range may be converted into light at a second wavelength range.

The low temperature oxide film 170 may be disposed on the molding part 250 and the configuration of the low temperature oxide film 170 is described above. The light emitting device package according to this embodiment may include the low temperature oxide film having the unevenness structure formed on a surface thereof. Because of that, luminous efficiency of the light emitted from the light emitting device may be enhanced. The low temperature oxide film may have the thickness of 1~10 micrometers and the nanometer-sized unevenness may be formed in the low temperature oxide film. The orientation angle of the light emitted outside the light emitting device package may be increased by the light refraction enabled by the unevenness.

Figure 3B:
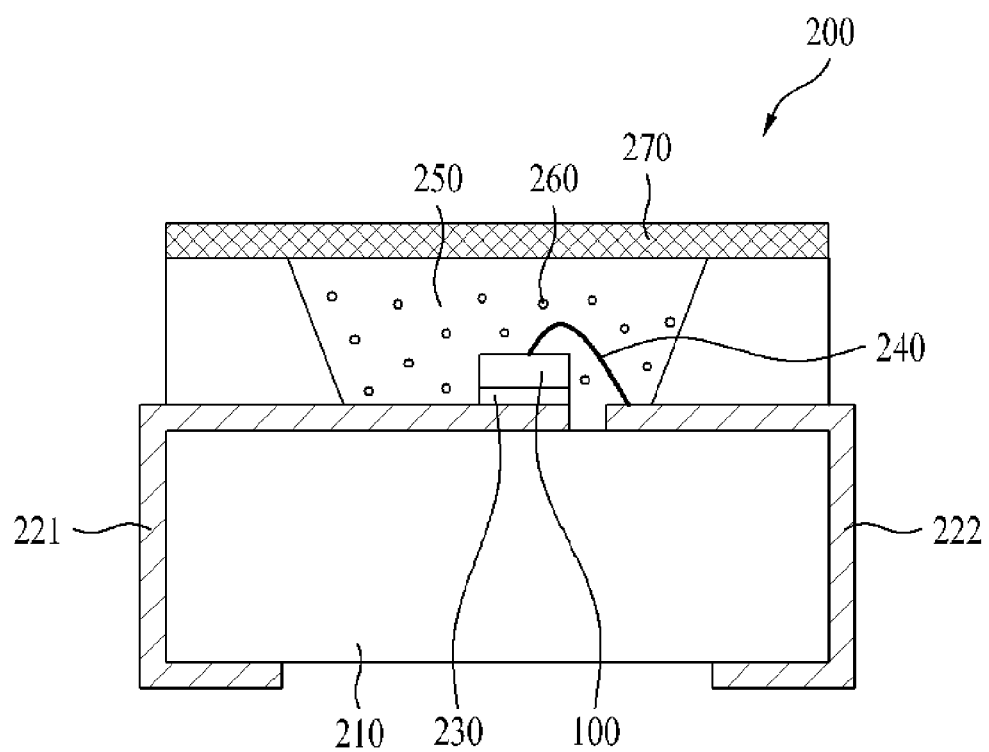

In the light emitting device package 200 according to the embodiment shown in FIG. 3B, the height of the molding part 250 may be identical to the height of the package body 210 and a low temperature oxide film 270 may be disposed in contact with the molding part 250 of the package body 210.

Figure 3C:
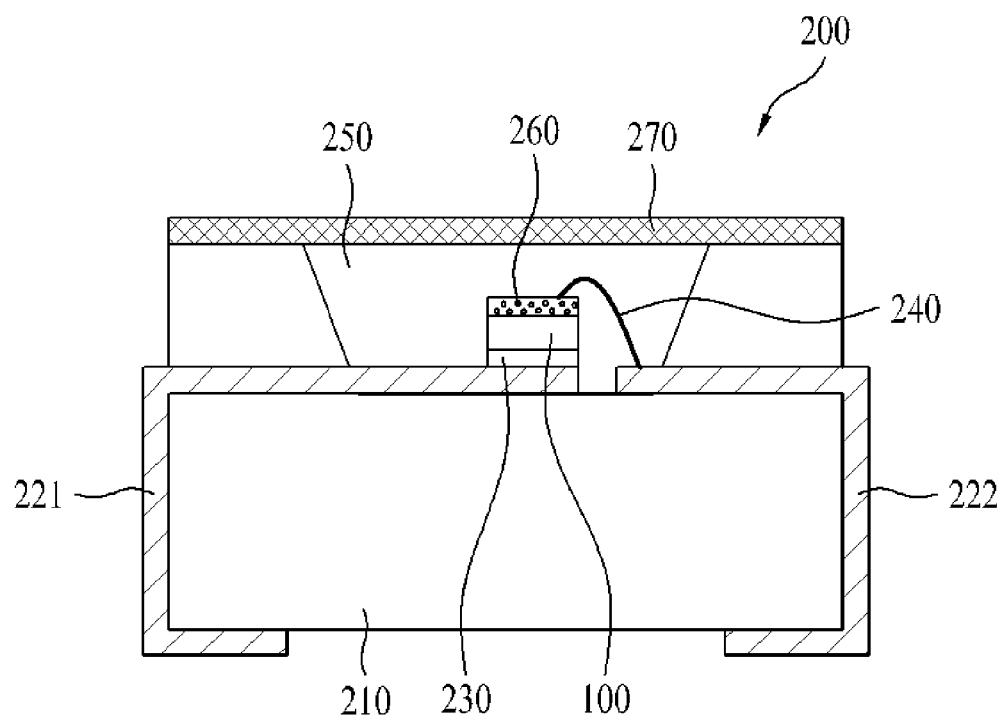

In the light emitting device package 200 according to the embodiment shown in FIG. 3C, the phosphors 260 may be coated in contact with the light emitting device 100 and the low temperature oxide film 270 may be disposed in contact with the molding part 250.

Figure 3D:
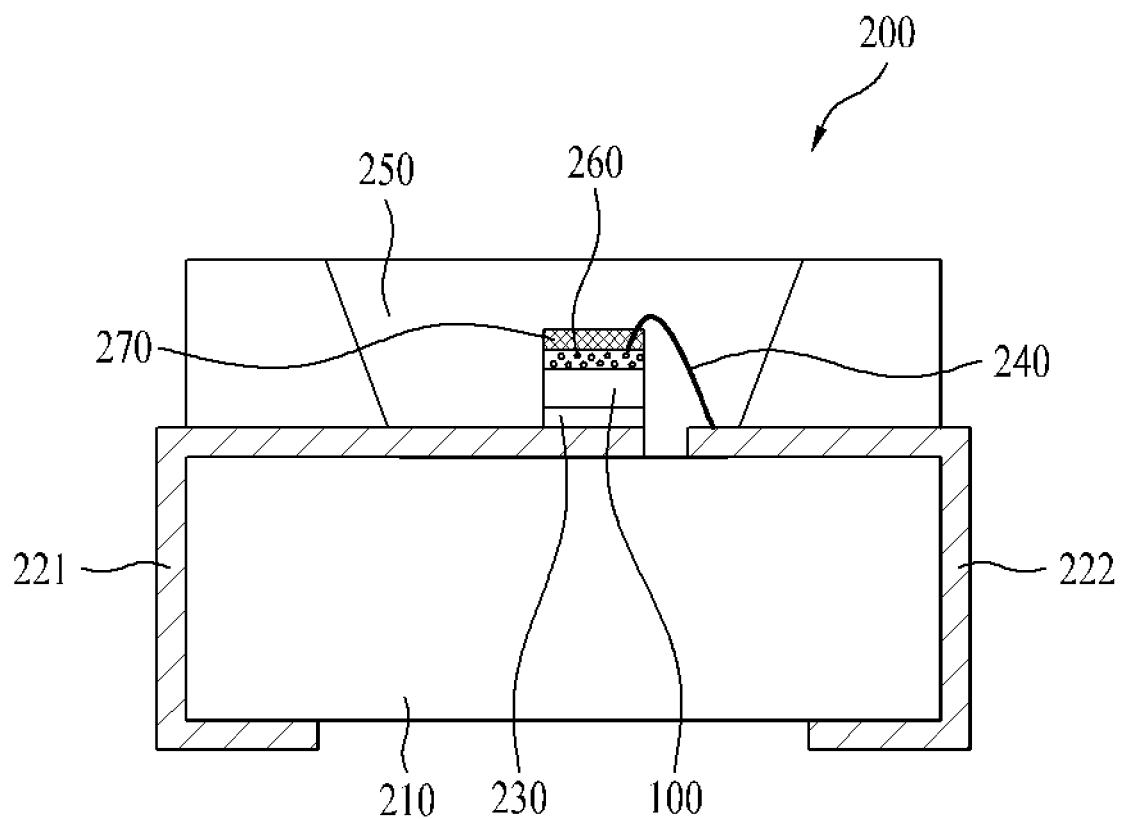

In the light emitting device package according to the embodiment shown in FIG. 3D, the phosphors 260 may be coated in contact with the light emitting device 100 and the low temperature oxide film 270 may be disposed in contact with the phosphors 260. The molding part 260 may be disposed in contact with the low temperature oxide film 270.

In the light emitting device 100 disposed in the light emitting device package 200 according to the embodiments shown in FIGS. 3A to 3D, the low temperature oxide film may be formed on a surface of the light emitting structure.

Figure 4:
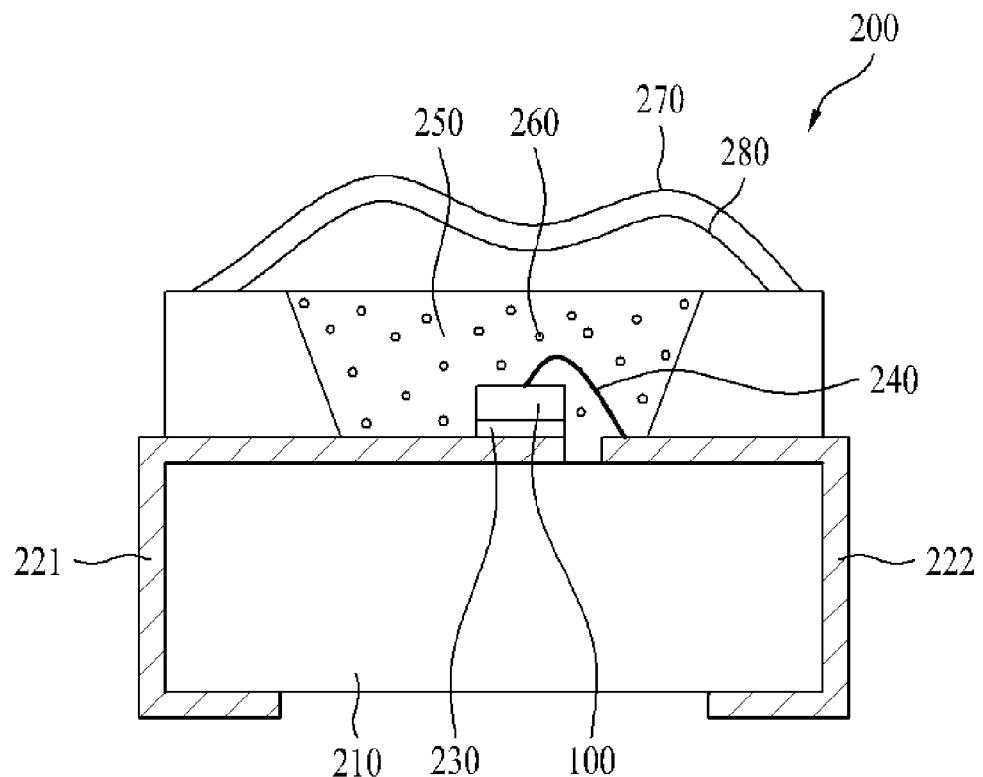
FIG. 4 is a sectional view illustrating a light emitting device package according to another embodiment.

FIG. 4 is a sectional view illustrating a light emitting device package according to another embodiment.

A light emitting device package 200 according to this embodiment is similar to the embodiment shown in FIG. 2 but it differs from the embodiment shown in terms of a lens 280 disposed on the molding part 250.

The lens 280 may convert a luminous passage, using refraction of the light at converted wavelength range by the phosphors after emitted from the light emitting device 100. In more detail, the lens 280 may adjust an orientation angle when the light emitting device package is used in a backlight unit.

The lens 280 may be formed of a material having a high transmissivity, for example, polyMethylMethAcrylate (PMMA), PolyCarbonate (PC), PolyEthylene (PE) or resin mold.

A low temperature oxide film 270 may be provided on the lens 280 of which detailed configuration and operation are the same as described above.

According to this embodiment, the low temperature oxide film 270 having an unevenness structure formed on a surface thereof may be disposed on a surface of the lens 280. Because of that, extraction efficiency of the light emitted from the light emitting device may be enhanced. In addition, the low temperature oxide film 270 may adjust an orientation angle of the emitted light, at the surface of the lens 280. The lens 280 may not have unevenness necessarily and the low temperature oxide film 270 may be formed along a profile of the lens 280.

The plurality of the light emitting device packages according to the embodiment may be arrayed on a substrate. As optical members, a light guide plate, a prism sheet and a diffusion sheet may be arranged on a luminous passage of the light emitting device packages. Those light emitting device packages, the substrate and the optical members may be functioned as a light unit. A further embodiment may be realized by a display device, a pointing device or a lighting system including the semiconductor light emitting device or the light emitting device package according to the embodiments. For example, the lighting system may include a lamp and a streetlamp.

FIGS. 5 to 10 are diagrams illustrating a fabricating process of the light emitting device shown in FIG. 1 according to an embodiment.

Figure 5:
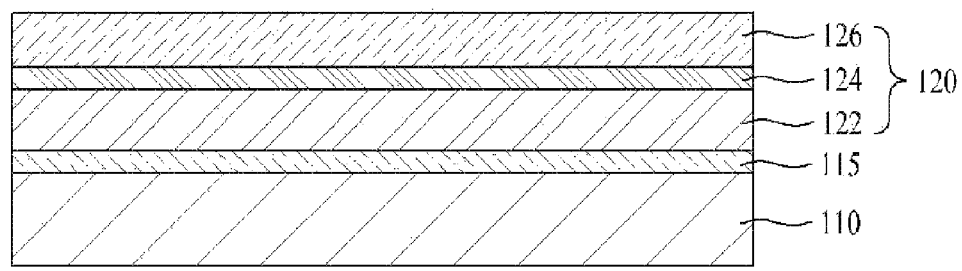
FIGS. 5 to 10 are diagrams illustrating a process of fabricating the light emitting device shown in FIG. 1.

First of all, as shown in FIG. 5, on the substrate 110 may grow the light emitting structure 120 including the buffer layer 115 and the first conductive type semiconductor layer 122, the active layer 124 and the second conductive type semiconductor layer 126.

The light emitting structure 120 may be formed based on metal organic vapor deposition (MOCVD), chemical vapor deposition (CVD), plasma-enhanced chemical vapor deposition (PECVD), molecular beam epitaxy (MBE) and hydride vapor phase epitaxy (MBE) and the embodiment is not limited thereto.

The substrate 110 may include a conductive substrate or an insulative substrate. For example, at least one of sapphire ($Al_2O_3$), SiC, GaAS, GaN, ZnO, Si, GaP, InP, Ge and $Ga_2O_3$ may be used. An unevenness structure may be formed on the substrate 110 and this embodiment is not limited thereto. Wet-cleaning may be performed to the substrate 110 and impurity may be removed from a surface of the substrate 110.

The buffer layer 115 may grow between the light emitting structure and the substrate 110, to reduce lattice mismatch of the materials and a difference of thermal expansion coefficients between them. The buffer layer may be formed of a III-V compound semiconductor, for example, GaN, InN, AlN, InGaN, AlGaN, InAlGaN and AlInN. An undoped semiconductor layer may be formed on the buffer layer and the embodiment is not limited thereto.

The light emitting structure may grow based on a vapor deposition method such as metal organic chemical vapor deposition (MOCVD), molecular beam epitaxy (MBE), hydride vapor phase epitaxy (HYPE).

The configuration of the first conductive type semiconductor layer 122 is the same as mentioned above and an n-GaN may be formed based on CVD, MBE, sputtering or HVPE. Also, the first conductive type semiconductor layer 110 may be formed by injecting into a chamber silane gas ($SiH_4$) having n-impurity such as trimethyl gallium gas (TMGa), ammonia gas ($NH_3$), nitrogen gas ($N_2$) and silicon (Si).

The configuration of the active layer 124 is the same as mentioned above. For example, the trimethyl gallium gas (TMGa), the ammonia gas ($NH_3$), the nitrogen gas ($N_2$) and trimethyl indium gas (TMIn) may be injected, and then a multi quantum well structure may be formed. The embodiment is not limited thereto.

The configuration of the second conductive type semiconductor layer 126 may be the same as mentioned above. A p-GaN layer may be formed by injecting into a chamber Bisethylcyclopentadienyl magnesium ($EtCp_2Mg$) {(($Mg(Cp_2H_5C_5H_4)_2$) having p-type impurity such as trimethyl gallium gas (TMGa), ammonia gas ($NH_3$), nitrogen gas ($N_2$) and magnesium (Mg) into a chamber, and this embodiment is not limited thereto.

Figure 6:
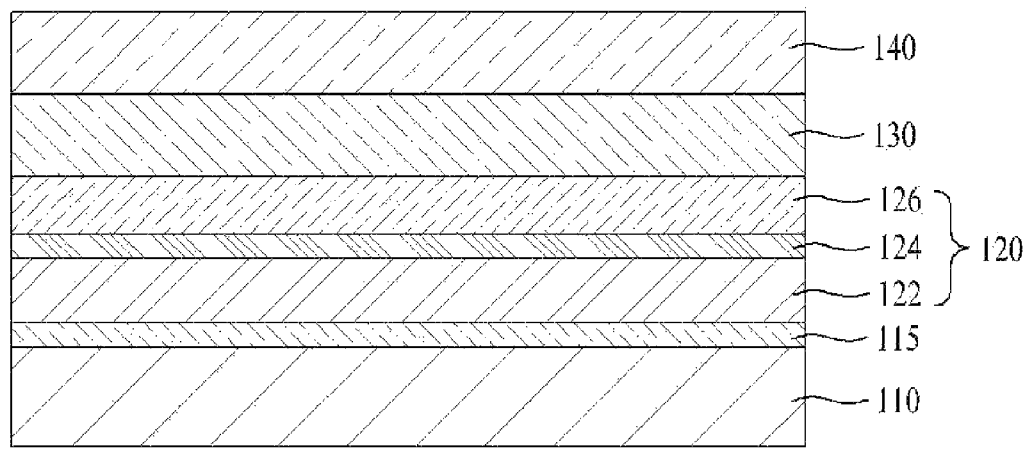

As shown in FIG. 6, the ohmic layer 130 and the reflective layer 140 may be formed on the light emitting structure 120. The configurations of the ohmic layer 130 and the reflective layer 140 are the same as mentioned above and they may be formed based on sputtering or electron beam deposition.

If ITO is used for the ohmic layer 130 in case the active layer 124 is emitting an ultraviolet light, transmissivity efficiency of the ultraviolet light might not be good. The ohmic layer 130 may be formed of Ni/Au.

Figure 7:

Hence, as shown in FIG. 7, the adhesion layer 150 and the metal support 160 may be formed on the reflective layer 140. Electrochemical metal deposition or bonding that uses eutectic metal may be used to form the metal support 160, or an additional adhesion layer 160 may be formed.

Figure 8:
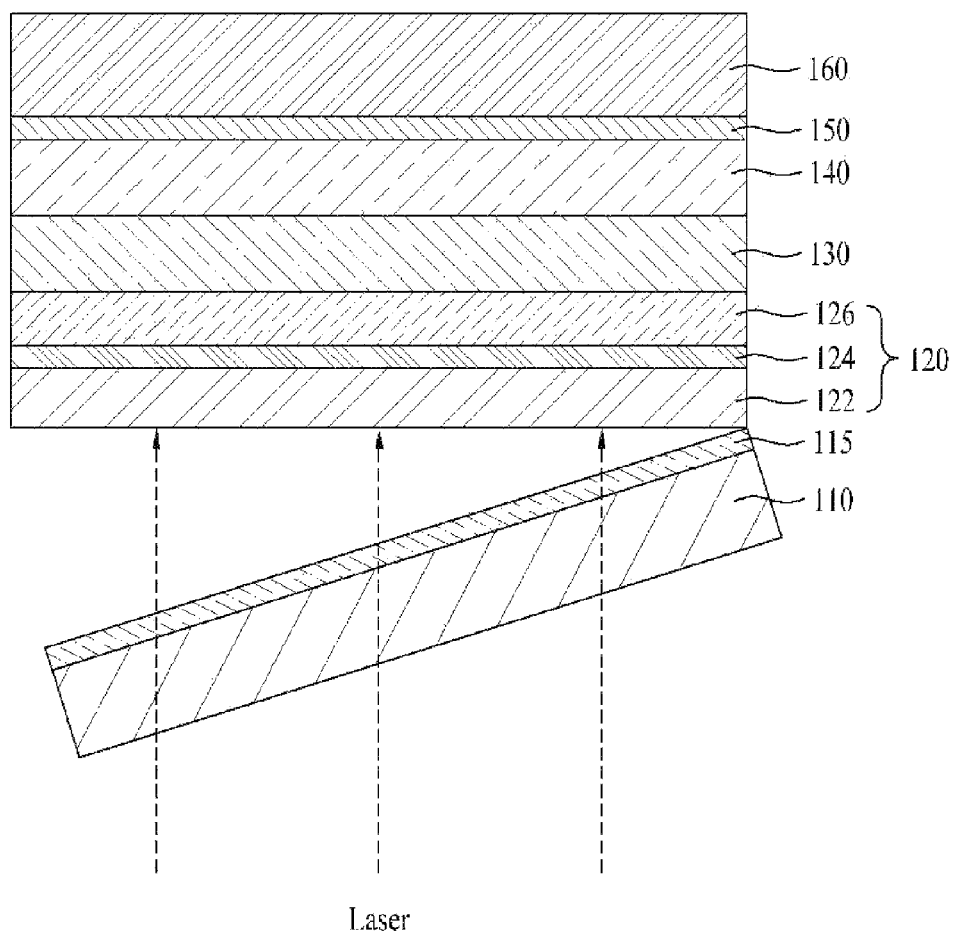

Hence, as shown in FIG. 8, the substrate 110 may be separated. The separation of the substrate 110 may be performed based on laser lift off (LLO) that uses excimer laser or based on dry-etch and wet-etch.

In the laser lift off as an example, excimer laser light having a preset wavelength range is focused toward the substrate 110. After that, a thermal energy is focused on an edge of the light emitting structure 120 and the edge is divided into gallium molecules and nitrogen molecules. The substrate 110 is momentarily separated from the buffer layer 115 along a region the laser light passes, while the edge is divided into the gallium molecules and the nitrogen molecules.

Figure 9:
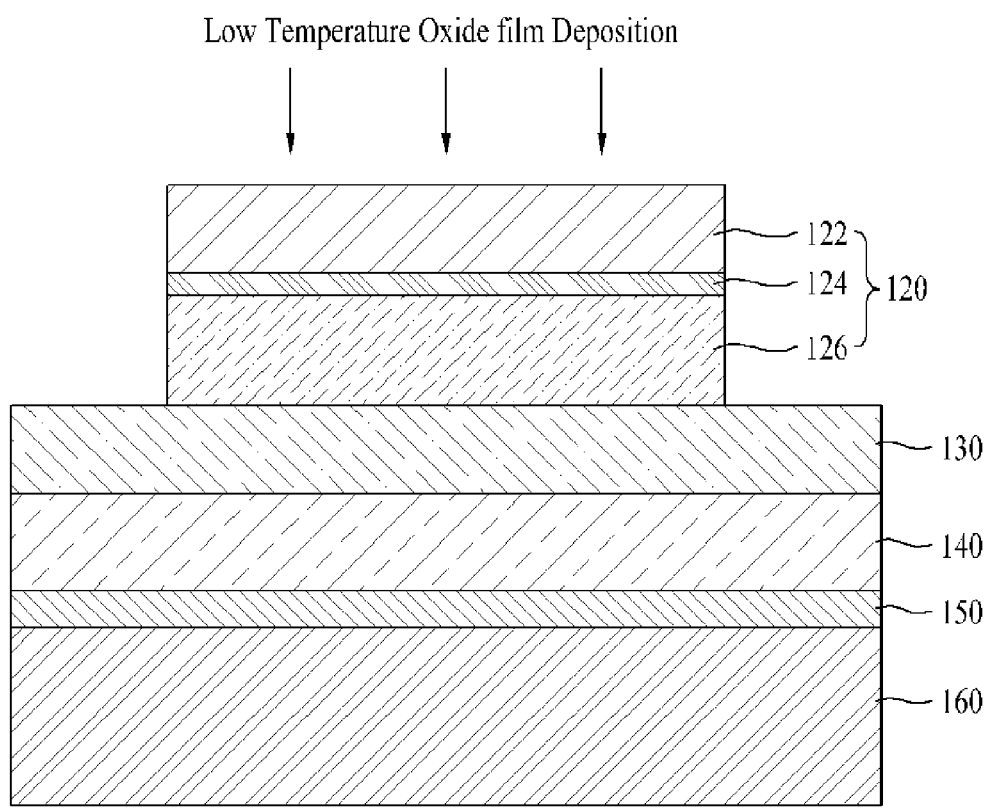

Hence, as shown in FIG. 9, the light emitting structure may be diced in devices units. After that, the low temperature oxide film 170 may be deposited on the surface of the light emitting structure 120. The low temperature oxide film 170 may be deposited at relatively low temperatures such as 400~450° C. based on low pressure chemical vapor deposition (LPCVD).

The LPCVD method uses diffusion to form a thin oxide film. Because of that, roughness may be generated on a surface of the oxide film and the low temperature oxide film having the unevenness structure may be formed accordingly.

Figure 10:
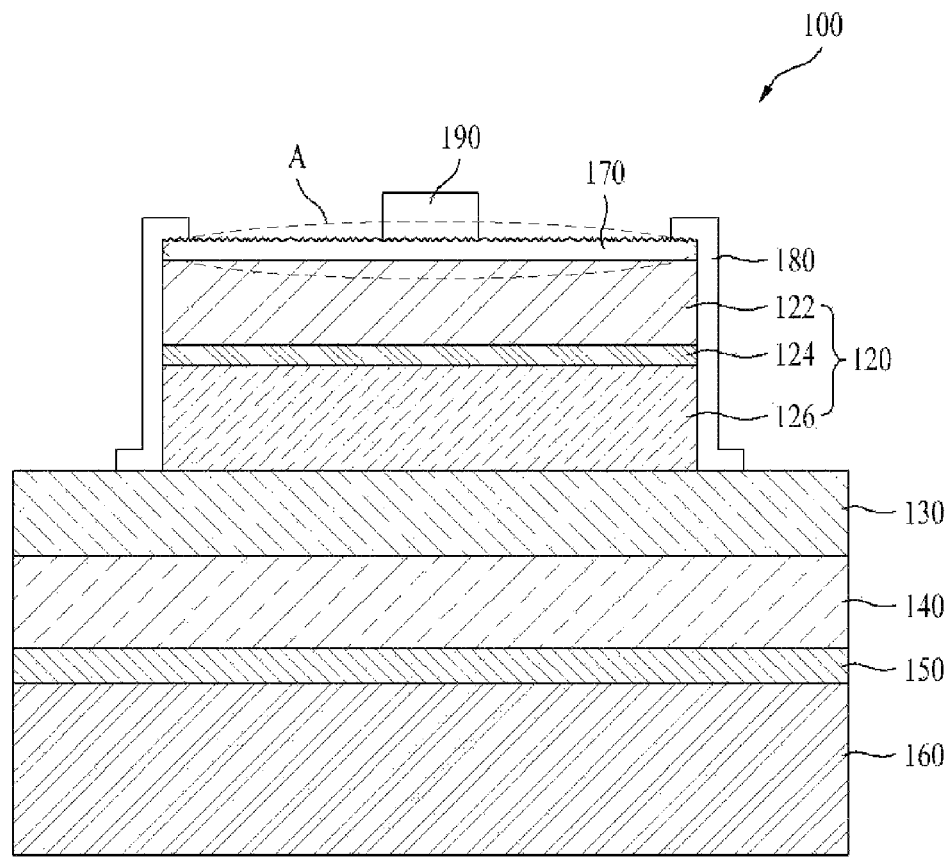

Hence, as shown in FIG. 10, the first electrode 190 may be formed on the surface of the low temperature oxide film 170 and the passivation layer 180 may be formed on the lateral surfaces of the light emitting structure 120.

Figure 11A:
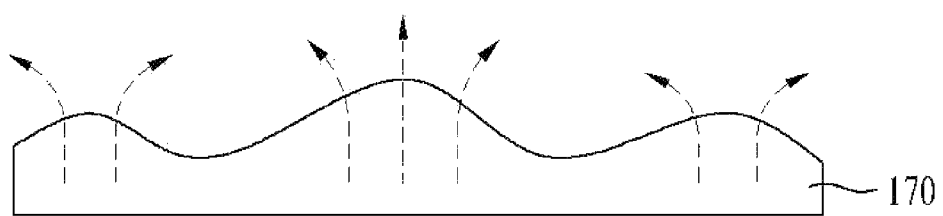
FIGS. 11A to 11C are diagrams illustrating action of a low temperature oxide film provided in the light emitting device shown in FIG. 1.
Figure 11B:
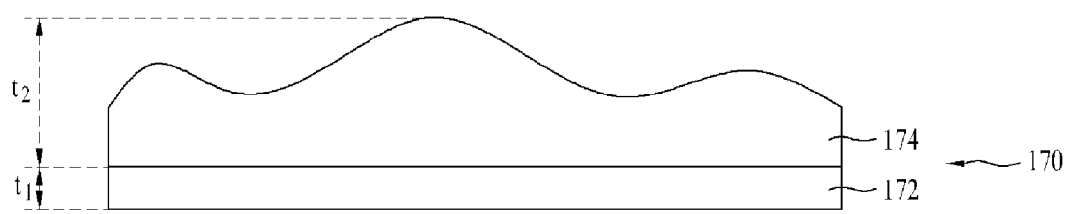
Figure 11C:
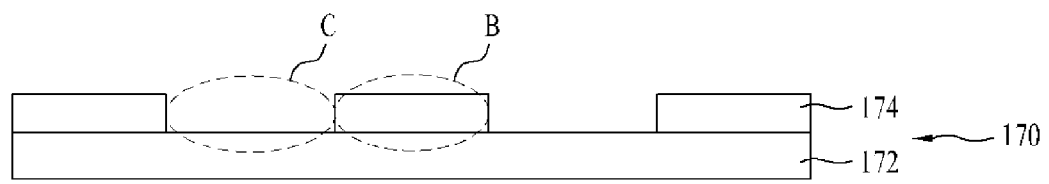

FIGS. 11A to 11C are diagrams illustrating the operation of the low temperature oxide film in the light emitting device shown in FIG. 1.

The roughness or unevenness may be formed on the surface of the low temperature oxide film 170 and the light transmitting the surface may be refracted as shown in referenced to as an arrow. As a result, the extraction efficiency of the light may be enhanced and the low temperature oxide film having the unevenness structure may contribute to the increase of the orientation angle in the light emitting device package.

The low temperature oxide film 170 may be configured of two layers as shown in FIG. 11A. according to the embodiment shown in the embodiment shown in FIG. 11B, a first layer 172 of the two layers may be disposed in contact with the light emitting structure, with a preset thickness ($t_1$) and a second layer 174 may be disposed on a surface of the first layer 172, with irregular thickness ($t_2$). At this time, the thickness ($t_1$) of the first layer 172 may be 1 to 5 micrometers and the thickness ($t_2$) of the second layer 174 may be 1 to 5 micrometers. The thickness ($t_1$) of the first layer 172 may be different from the thickness ($t_2$) of the second layer 174.

According to the embodiment shown in FIG. 11C, the low temperature oxide film 170 may be configured of the first layer 172 in contact with the light emitting structure and the second layer 174 selectively disposed on the surface of the first layer 172. The low temperature oxide film may be configured of the first layer 172 and the second layer 174 in a region referenced to as 'B' shown in FIG. 11C and it may be configured of only the first layer 172 in a region referenced to as 'C'.

As follows, a lighting device and a backlight unit will be described as an embodiment of the lighting system including the light emitting device package disposed therein.

Figure 12:
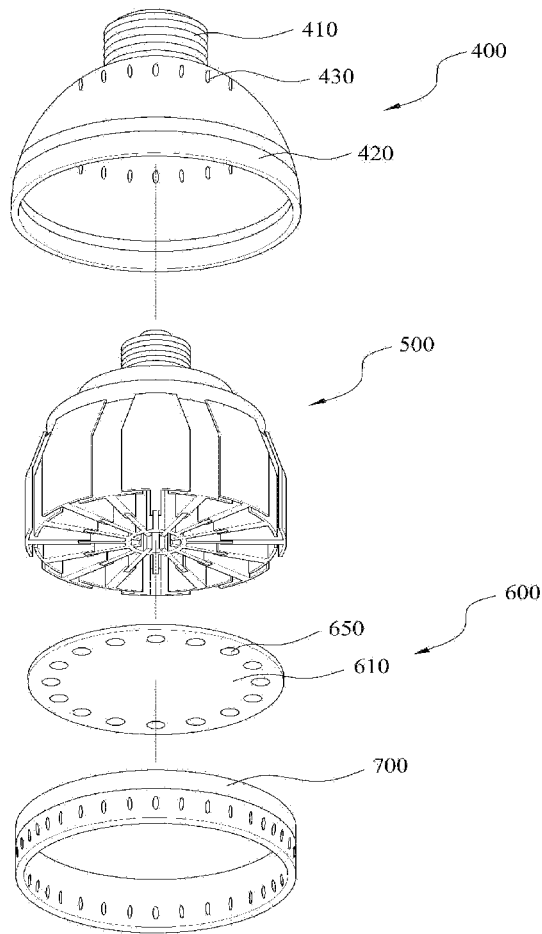
FIG. 12 is an exploded perspective view illustrating a lighting system including the light emitting device package according to the embodiments.

FIG. 12 is an exploded perspective view illustrating a lighting device according to an embodiment.

A lighting device according to this embodiment may include a light source 600 to emit light, a housing 400 to mount the light source 600 therein, a radiation part 500 to radiate the heat of the light source 600, and a holder 700 to couple the light source 600 and the radiation part 500 to the housing 400.

The housing 400 may include a socket coupling part 410 coupled to an electric socket (not shown) and a housing body part 420 connected to the socket coupling part 410 to mount the light source 600 therein. A single air-hole 430 may be formed through the housing body part 420.

A plurality of air holes 430 may be provided in the housing body part 420 of the housing 400. A single air hole may be provided or a plurality of air holes may be arranged along a radial direction as shown in FIG. 12. Rather than the radial arrangement, other various arrangements of the air holes may be possible.

The light source 600 may include a plurality of the light emitting modules 650 disposed on a circuit board 610. Here, the circuit board 610 may be formed in a shape that is able to be inserted in an opening of the housing 400 and it may be formed of a material having a high thermal conductivity to transmit heat to the radiation part 500 which will be described in detail later.

The holder 700 may be provided under the light source and the holder 700 may include a frame and another air hole. Although not shown in the drawing, under the light source 600 may be provided optical members to diffuse, scatter or collect the light emitted from the light emitting modules of the light source 600.

Figure 13:
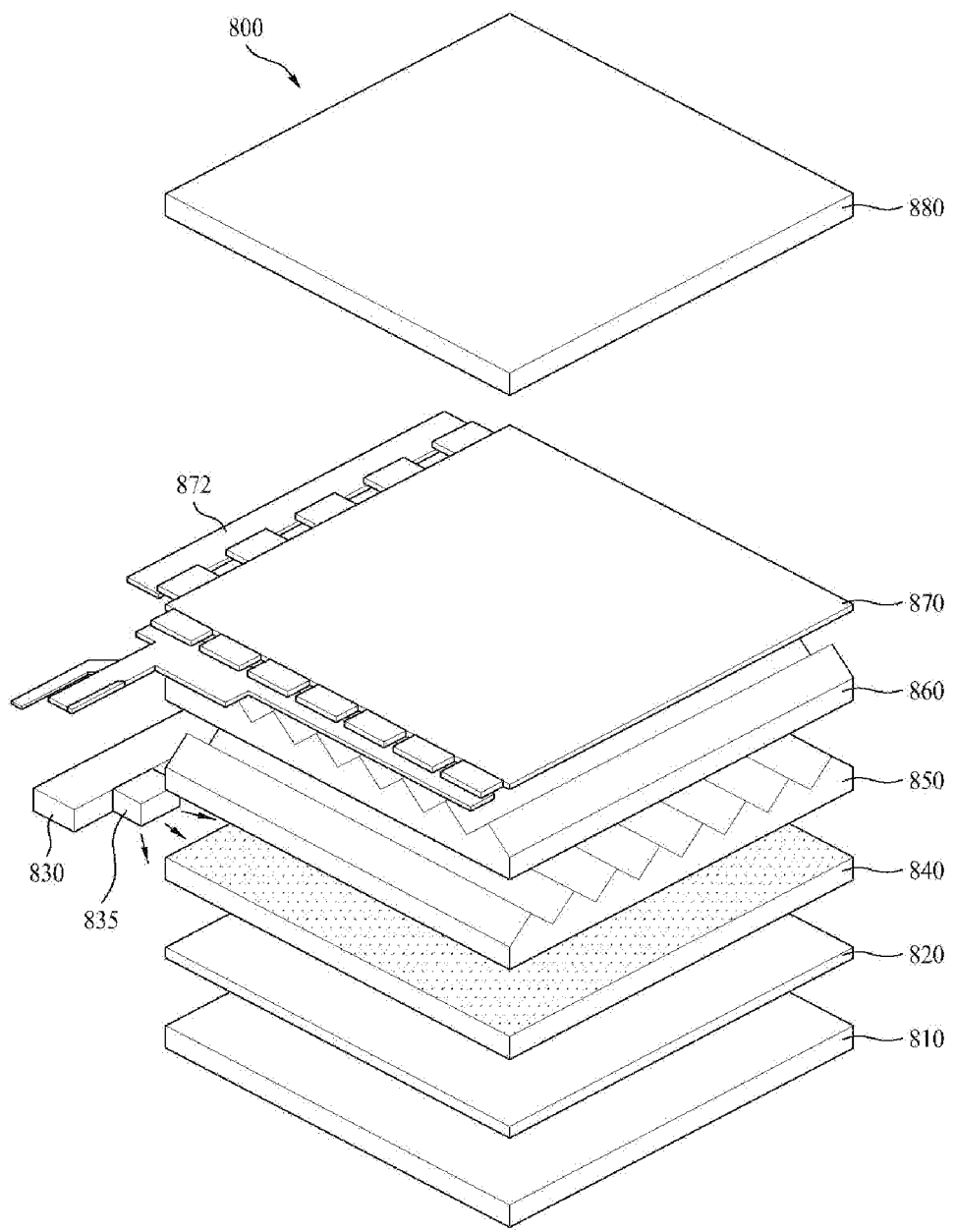
FIG. 13 is a diagram illustrating a display device according to an embodiment that includes the light emitting device package according to the embodiments.

FIG. 13 is a diagram illustrating a display device according to an embodiment that includes the light emitting device package arranged therein.

As shown in FIG. 13, an image display device 800 according to this embodiment may include light source modules 830 and 835, a reflective plate 820 disposed on a bottom cover 810, a light guide panel 840 disposed in front of the reflective plate 820 to guide light emitted from the light source modules to a front part of the image display device, a first prism sheet 850 and a second prism sheet 860 disposed in front of the light guide panel 840, a display panel 870 disposed in front of the second prism sheet 860, an image signal output circuit 872 connected to the display panel 870 to supply an image signal to the display panel 870, and a color filter 880 disposed in front of the panel 870.

The light source module may include the light emitting device packages 835 described above disposed on a circuit board 830. Here, a PCB may be used as the circuit board 830 and the light emitting device packages 835 may be the same as described in reference to FIG. 13.

The bottom cover 810 may accommodate elements provided in the image display device 800. The reflective plate 820 may be provided as a separate element as shown in FIG. 13 or it may be provided by coating a rear surface of the light guide panel 840 or a front surface of the bottom cover 810 with a material having a high reflectivity.

Here, the reflective plate 820 may be formed of a material having a high reflectivity that is useable in an ultra-thin type such as polyethylene terephthalate (PET).

The light guide panel 840 may scatter the light emitted from the light emitting device package module, to uniformly distribute the light throughout an entire screen of the liquid crystal display device. As a result, the light guide panel 840 may be formed of a material having a high index of refraction and a high transmissivity such as polymethylemethacrylate (PMMA), polycarbonate (PC) or polyethylene (PE). Further, an air guide-type display device in which the light guide panel 840 is omitted and in which light is transmitted in a space above the reflective plate 820.

The first prism sheet 850 may be formed of a light transmissive polymer having elasticity on a surface of a support film. The polymer may have a prism layer having a plurality of three-dimensional structures formed thereon repeatedly. Here, the plurality of the patterns may be formed in a strip type having crests and troughs repeated therein.

A direction of crests and troughs formed on a surface of a support film of the second prism sheet 860 may be perpendicular to a direction of the crests and troughs formed in a surface of the support film of the first prism sheet 850. This may serve to uniformly distribute the light transmitted from the light source module and the reflective plate 820 in all directions of the panel 870.

Although the first prism sheet 850 and the second prism sheet 860 compose an optical sheet in this embodiment, the optical sheet may be configured of another combination, for example, a micro lens array, a combination of a diffusion sheet and a lens array or combination of a prism sheet and a lens array.

As the panel 870, a liquid crystal display panel may be provided or other kinds of display devices requiring a light source may be provided instead of the liquid crystal display panel.

The panel 870 may have a structure in which a liquid crystal layer is located between glass bodies, with polarizing plates mounted on the glass bodies, respectively, to utilize polarization of light. Here, the liquid crystal layer may have intermediate properties between a liquid and a solid in which organic molecules having fluidity like a liquid, i.e., liquid crystal, are regularly arranged. The panel may display an image, using changed molecular arrangement by an external electric field.

The liquid crystal display panel used in the image display device may be formed as an active matrix, and it may use transistors as switches to adjust voltage supplied each of the pixels.

The floor filter 880 may be provided on the front surface of the panel 870. The color filter 880 may transmit only red, green and blue light from lights projected by the panel 870 per one pixel, only to display an image.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure comprising a first conductive type semiconductor layer, an active layer and a second conductive type semiconductor layer;
    a first electrode disposed on the first conductive type semiconductor layer;
    a second electrode disposed on the second conductivity type semiconductor layer; and
    a low temperature oxide film disposed on the light emitting structure, with an irregular thickness,
    wherein the low temperature oxide film comprises a first layer and a second layer, the first layer being disposed on an entire top surface of the light emitting structure and having a uniform thickness, and the second layer being disposed on an entire top surface of the first layer and having an irregular thickness.

2. The light emitting device according to claim 1, wherein unevenness is formed on a surface of the low temperature oxide film.

3. The light emitting device according to claim 1, wherein the low temperature oxide film is disposed at least one of a surface of the first conductive type semiconductor layer and a surface of the second conductive type semiconductor layer.

4. The light emitting device according to claim 1, further comprising:
    a passivation layer disposed on a lateral surface of the light emitting structure.

5. The light emitting device according to claim 4, wherein the passivation layer is in contact with a lateral surface and a portion of a top surface of the low temperature oxide film, and
    wherein another portion of the surface of the low temperature oxide film is opened.

6. The light emitting device according to claim 4, wherein the passivation layer comprises at least one selected from the group consisting of a silicon oxide ($SiO_2$) layer, an oxinitride layer, an aluminum oxide layer and a nitride layer.

7. The light emitting device according to claim 1, wherein the low temperature oxide film is formed on at least two layers.

8. The light emitting device according to claim 1, wherein the thickness of the first layer is different from that of the second layer.

9. The light emitting device according to claim 1, wherein at least one of the thickness of the first or the thickness of the second layers is 1 micrometer to 5 micrometers.

10. The light emitting device according to claim 1, wherein the low temperature oxide film comprises a transmissive material.

11. The light emitting device according to claim 1, wherein the low temperature oxide film comprises silicon oxide.

12. The light emitting device according to claim 1, wherein the low temperature oxide film is deposited at 400° C. to 450° C.

13. The light emitting device according to claim 1, wherein the thickness of the low temperature oxide film is 1 micrometer to 10 micrometers.

14. The light emitting device according to claim 4, wherein a material composing the passivation layer is different from a material composing the low temperature oxide.

15. A lighting system comprising:
    a light emitting device package comprising:
        a package body;
        a first lead frame and a second lead frame disposed on the package body; and
        a light emitting device disposed on the package body, to be electrically connected with the first lead frame and the second lead frame, the light emitting device comprising a light emitting structure comprising:
            a first conductive type semiconductor layer;
            an active layer and a second conductive type semiconductor layer;
            a first electrode disposed on the first conductive type semiconductor layer;
            a second electrode disposed on the second conductive type semiconductor layer; and
            a low temperature oxide film disposed on the light emitting structure, with an uneven thickness,
            wherein the low temperature oxide film comprises a first layer and a second layer, the first layer being disposed on an entire top surface of the light emitting structure and having a uniform thickness, and the second layer being disposed on an entire top surface of the first layer and having an irregular thickness;
    a circuited board on which the light emitting device package is connectedly disposed; and
    an optical member to transmit light emitted from the light emitting device package.

16. The lighting system according to claim 15, wherein the low temperature oxide film is disposed on the molding part.

17. The lighting system according to claim 15, further comprising:
    a phosphor layer coated on the light emitting device,
    wherein the low temperature oxide film is disposed on a surface of the phosphor layer.

18. The a lighting system according to claim 15, further comprising:
    a lens disposed on the molding part,
    wherein the low temperature oxide film is disposed on the lens.

19. The lighting system according to claim 15, wherein a top surface of the second layer has a pattern, and the pattern has an irregular height from a top surface of the first layer.

20. The light emitting device according to claim 1, wherein a top surface of the second layer has a pattern, and the pattern has an irregular height from a top surface of the first layer.

* * * * *